United States Patent
Foster

(10) Patent No.: US 7,327,293 B2
(45) Date of Patent: Feb. 5, 2008

(54) COMPRESSION AND DATA ENCODING FOR TRANSMISSION OVER A CHARACTER-BASED PROTOCOL

(75) Inventor: Eric N. Foster, Sykesville, MD (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/367,670

(22) Filed: Mar. 3, 2006

(65) Prior Publication Data

US 2007/0205925 A1    Sep. 6, 2007

(51) Int. Cl.
*H03M 7/20* (2006.01)
(52) U.S. Cl. .................... 341/103; 341/102; 341/90
(58) Field of Classification Search ............. 341/102, 341/103, 106
See application file for complete search history.

(56) References Cited

U.S. PATENT DOCUMENTS

| | | | |
|---|---|---|---|
| 3,945,002 A * | 3/1976 | Duttweiler et al. ......... | 704/205 |
| 5,387,911 A * | 2/1995 | Gleichert et al. ............. | 341/95 |
| 5,396,228 A * | 3/1995 | Garahi ....................... | 340/7.53 |
| 6,161,711 A * | 12/2000 | Miceli et al. ................ | 215/206 |
| 6,289,130 B1 | 9/2001 | Cooklev | |
| 6,636,166 B2 * | 10/2003 | Sessions et al. .............. | 341/63 |
| 6,677,888 B2 | 1/2004 | Roy | |
| 6,812,670 B2 * | 11/2004 | Minamiura et al. ......... | 320/116 |
| 6,876,315 B1 * | 4/2005 | Widmer ....................... | 341/58 |
| 7,205,911 B2 * | 4/2007 | Kim et al. .................... | 341/58 |
| 2003/0030581 A1 | 2/2003 | Roy | |

* cited by examiner

*Primary Examiner*—Linh Nguyen
(74) *Attorney, Agent, or Firm*—David N Fogg; Fogg & Powers LLC

(57) ABSTRACT

ACARS systems and methods for compiling messages includes a processing device configured for mapping eight-bit characters in an eight-bit character stream into a six bit map to create a generally six-bit character stream. The processing device is further configured for encoding the generally six-bit character stream into an eight-bit character stream. Optionally, the processing device includes a look-up table configured to retrieve substituted six-bit characters in response to the presence of the eight-bit character received at a processor.

23 Claims, 4 Drawing Sheets

EXAMPLE CHARACTER MAP

| 8-BIT CHARACTER | 6-BIT VALUE | 8-BIT CHARACTER | 6-BIT VALUE | 8-BIT CHARACTER | 6-BIT VALUE | 8-BIT CHARACTER | 6-BIT VALUE |
|---|---|---|---|---|---|---|---|
| CR - 0x0d | 0x00 | / - 0x2f | 0x10 | ? - 0x3f | 0x20 | O - 0x4f | 0x30 |
| SP - 0x20 | 0x01 | 0 - 0x30 | 0x11 | @ - 0x40 | 0x21 | P - 0x50 | 0x31 |
| ! - 0x21 | 0x02 | 1 - 0x31 | 0x12 | A - 0x41 | 0x22 | Q - 0x51 | 0x32 |
| " - 0x22 | 0x03 | 2 - 0x32 | 0x13 | B - 0x42 | 0x23 | R - 0x52 | 0x33 |
| # - 0x23 | 0x04 | 3 - 0x33 | 0x14 | C - 0x43 | 0x24 | S - 0x53 | 0x34 |
| $ - 0x24 | 0x05 | 4 - 0x34 | 0x15 | D - 0x44 | 0x25 | T - 0x54 | 0x35 |
| % - 0x25 | 0x06 | 5 - 0x35 | 0x16 | E - 0x45 | 0x26 | U - 0x55 | 0x36 |
| & - 0x26 | 0x07 | 6 - 0x36 | 0x17 | F - 0x46 | 0x27 | V - 0x56 | 0x37 |
| ' - 0x27 | 0x08 | 7 - 0x37 | 0x18 | G - 0x47 | 0x28 | W - 0x57 | 0x38 |
| ( - 0x28 | 0x09 | 8 - 0x38 | 0x19 | H - 0x48 | 0x29 | X - 0x58 | 0x39 |
| ) - 0x29 | 0x0a | 9 - 0x39 | 0x1a | I - 0x49 | 0x2a | Y - 0x59 | 0x3a |
| * - 0x2a | 0x0b | : - 0x3a | 0x1b | J - 0x4a | 0x2b | Z - 0x5a | 0x3b |
| + - 0x2b | 0x0c | ; - 0x3b | 0x1c | K - 0x4b | 0x2c | \ - 0x5b | 0x3c |
| , - 0x2c | 0x0d | < - 0x3c | 0x1d | L - 0x4c | 0x2d | ^ - 0x5c | 0x3d |
| - - 0x2d | 0x0e | = - 0x3d | 0x1e | M - 0x4d | 0x2e | _ - 0x5d | 0x3e |
| . - 0x2e | 0x0f | > - 0x3e | 0x1f | N - 0x4e | 0x2f | | - 0x7c | 0x3f |

FIG. 2

COMPRESSION AND DATA ENCODING FOR TRANSMISSION OVER A CHARACTER-BASED PROTOCOL

BACKGROUND OF THE INVENTION

ACARS (Aircraft Communication Addressing and Reporting System) is a digital data link system transmitted via radio that allows airline flight operations departments to communicate with the various aircraft in their fleet.

ACARS is a VHF digital transmission system used by many military and civilian aircraft. It is analogous to "email for airplanes," as the registration of each aircraft is it's unique address in the system developed by ARINC (Aeronautical Radio, Inc.). Traffic is routed through services such as the ARINC and SITA computers to the proper company or airplane, relieving some of the necessity for routine voice communication with the company. With ACARS, such routine items as departure reports, arrival reports, passenger loads, fuel data, engine performance data, and much more, can be requested by the company and retrieved from the aircraft at automatic intervals. Before the advent of ACARS, flight crews had to use voice transmission to relay this data to their operations on the ground.

The ACARS system comprises the following elements:

1. The Airborne Subsystem, onboard the aircraft, which consists of the:
   a.) Management Unit Receives ground-to-air messages via the VHF radio transceiver, and controls the replies.
   b.) Control Unit is the aircrew interface with the ACARS system, consisting of a display screen and printer.

2. The ARINC Ground System, which consists of all the ARINC ACARS remote transmitting/receiving stations, and the ARINC computer and switching systems.

3. The Air Carrier C² (Command and Control) and Management Subsystem, which is basically all the ground based airline operations such as operations control, maintenance, crew scheduling and the like, linked up with the ACARS system.

Messages fall into two types characterized by their direction relative to the aircraft: "Downlinks" are those ACARS transmissions that originate in the aircraft, and "uplinks" are those messages sent from the ground station to the aircraft.

Airlines pay for transmission of data over the ACARS system according to numbers of bits sent and received. Character based protocols limit the set of characters that can be transmitted. Some characters in the 8-bit lexicon are reserved by character-based protocols to be used as delimiters. When so assigned, the reserved characters cannot be present in the character stream. The admissible number of characters that may be present in the data steam is, then, fewer than the 128 characters expressible in an 8-bit stream.

What is missing in the art are methods and systems for a reduction of the transmission bits for a more economical, loss-less encoding and transmission of data.

SUMMARY

ACARS systems and methods for compiling messages includes a processing device configured for mapping eight-bit characters in an eight-bit character stream into a six bit map to create a generally six-bit character stream. The processing device is further configured for encoding the generally six-bit character stream into an eight-bit character stream. Optionally, the processing device includes a look-up table configured to retrieve substituted six-bit characters in response to the presence of the eight-bit character received at a processor.

The mapping of the eight bit characters may, optionally, include substituting a first six bit character for the first eight bit character according to a look-up table; comparing a second eight bit character to characters contained in a look-up to produce a selected character; and concatenating the first six-bit character with the selected character to produce a six-bit character stream. In one embodiment, the selected character includes a six-bit character corresponding in the look-up table to an upper-case representation of the second eight bit character. In a second embodiment, at least one selected character includes a designated eight bit character or includes a flag bit to indicate that succeeding are characters outside of the initial 64 characters selected. In this embodiment, the state of the character stream toggles according to the presence of the flag bit in order to indicate that the eight-bit to six-bit mapping is being employed.

In an ACARS control unit for the compiling of ACARS messages, a processing device is configured for mapping eight-bit characters into a six-bit map to create a generally six-bit character stream. The processor is also configured for encoding the generally six-bit character stream into an eight-bit character stream. In doing so, a reduction of the number of bits necessary to express a character occurs.

The processing device is further configured for encrypting the generally six-bit character stream to produce an encrypted six-bit character stream as well as for encoding the encrypted generally six-bit character stream. By such encoding, the processing device is further configured for compressing the generally six-bit character stream to produce a compressed six-bit character stream and encrypting the compressed six-bit character stream.

The processing device configured for mapping of the eight-bit character can optionally be further configured for substituting a first six-bit character for an eight-bit character according to a look-up table. The processing device does this by comparing a second eight-bit character to characters contained in the look-up table and retrieving a selected eight-bit character to replace the second eight-bit character. Once selected, the selected eight-bit character is concatenate to the first six-bit character with the selected character to produce a generally six-bit character stream.

In some embodiments, the selected character is a six-bit character corresponding in the look-up table to an upper-case representation of the second eight-bit character. The selected character includes a designated eight-bit character as well as a flag bit.

As will readily be appreciate in reviewing the foregoing summary, ACARS systems and methods may loss-lessly compress data by means of regrouping the characters into new eight-bit representations exploiting the limited number of characters that ACARS accepts for transmission.

BRIEF DESCRIPTION OF THE DRAWINGS

The preferred and alternative embodiments of the present invention are described in detail below with reference to the following drawings.

FIG. 2 is a mapping table for performing the 8- to 6-bit character mapping;

DETAILED DESCRIPTION OF THE PREFERRED EMBODIMENT

An ACARS system and method for compiling messages includes a processing device configured for mapping eight-bit characters in an eight-bit character stream into a six bit map to create a generally six-bit character stream. The processing device is further configured for encoding the generally six-bit character stream into an eight-bit character stream. Optionally, the processing device includes a look-up table configured to retrieve substituted six-bit characters in response to the presence of the eight-bit character received at a processor.

Figure 1:
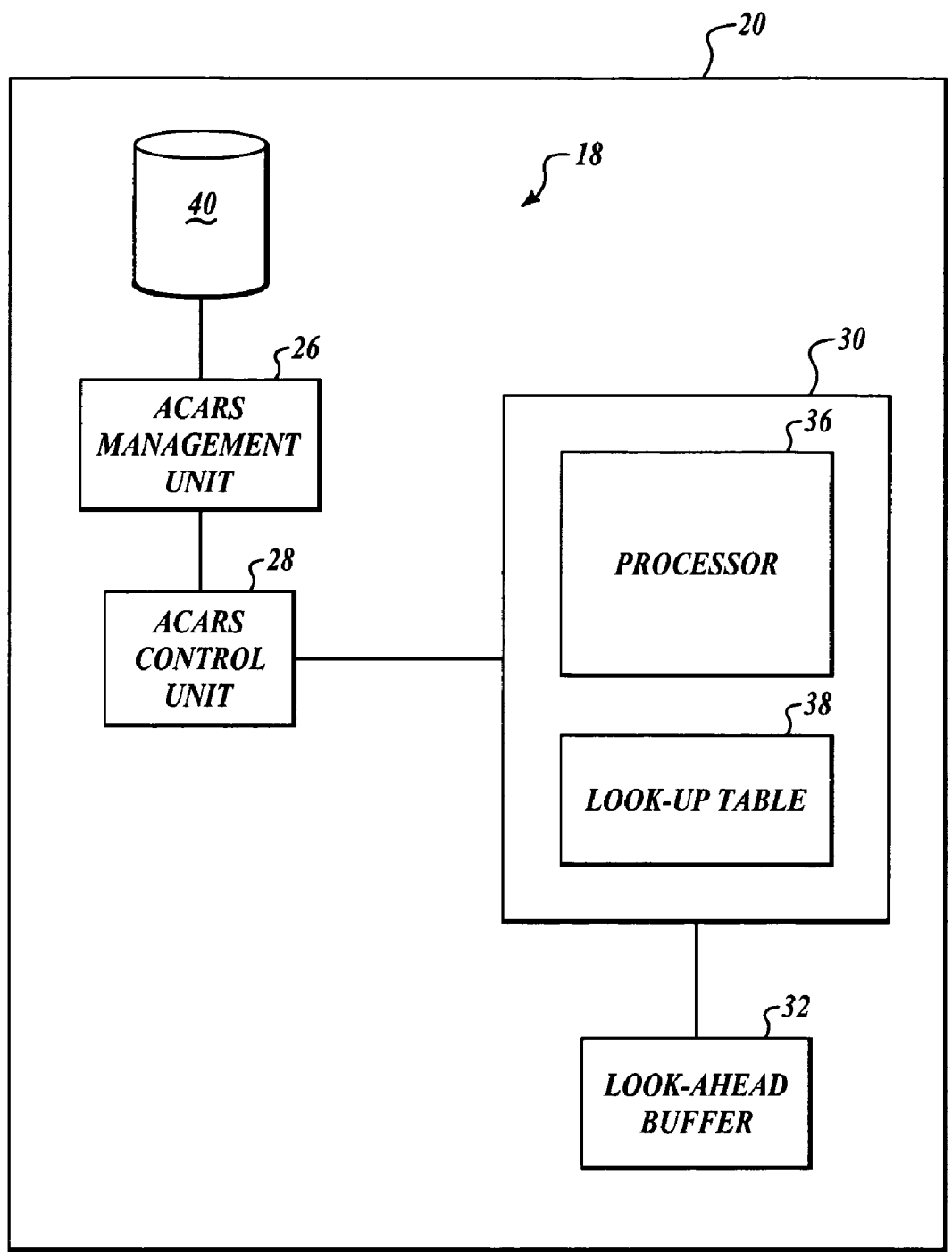
FIG. 1 is a block diagram of an exemplary ACARS system.

Referring to FIG. 1, a block diagram illustrates an exemplary system 18 on board an aircraft 20. The non-limiting exemplary system 18 includes an ACARS control unit 28 coupled to an ACARS management unit 26 and a processing device 30. The processing device 30 includes at least a processor 36. The processor 36 may also include a look-up table 38 which is a memory configured to output a datum in response to an input datum. The management unit 26 receives ground-to-air messages received from a VHF radio transceiver 40, and controls the replies. The exemplary system, though shown in an aircraft is substantially duplicated in a ground station to facilitate ground-to-air and air-to-ground communication.

The control unit 28 is an aircrew interface with an ACARS system, typically including a display screen, a user interface, and a printer. The ACARS control unit controls all peripherals and provides the necessary encapsulation of data into the ACARS protocol and format. The control unit 28 also generates the special condition and event messages to transmit character streams to the ground based systems or to multiple control & display units as well as being capable of display on pocket PCs and PDA devices onboard the aircraft 20. The control unit 28 also manages the communications connectivity by determining appropriate means the ACARS control unit will use for communications (per coverage).

In operation, the management unit 26 receives a character stream from the VHF radio transceiver 40. The management unit 26 passes received character stream to the control unit 28. Where the control unit 28 detects suitable delimiting characters in an incoming character stream, the control unit 28 sends the data succeeding the delimiting character to the processor 36 for translation. The processor 36, in turn, retrieves characters from the look-up table 38 according to bits contained in the character stream. In essence, the processor 36 maps received bits of the character stream into corresponding characters stored in the look-up table 38. A look-ahead buffer 32 is configured to hold an 8-bit sample of the data stream for provision to the processor 36. Because of the mapping, the processor 36 outputs the character stream as characters at the control unit 28 for transmission to the user as text or characters. When the management unit 26 detects a second suitable delimiting character, the management unit 26 reverts to the templated transmission of information to the control unit 28 strictly in accord with the ACARS protocol.

In transmission, the user inputs information into the control unit 28 by means of a user interface such as a keyboard. The control unit 28 assembles the information into character streams for transmission and determines such portions of the character streams as can be translated advantageously using the processor device 30. According to ACARS protocol, each message frame consists of at least 50, and up to a maximum of 272 characters or bytes. The message frames are suitably bracketed by delimiting characters defining the beginning and end of content within the frame. Expression of each character within the frame is by means of a 7-bit ACSII code with an additional eighth parity bit. Using the resulting 8-bit scheme results in a total message transmission duration that ranges between 0.17 and 0.91 seconds in practice. Thus, the portions of the message that fall within the frame are selected for translation as message segments consist of between 50 and 272 characters and lack the number of repeated strings that generally facilitate great compression of character streams.

The control unit 28 detects the delimiting characters in a message and passes the bracketed characters to the processor device 30. In ACARS protocol, the message frame format is rigidly defined to include synchronization, address, acknowledgment, mode and error checking characters, in addition to the actual message text. Within each of the frames, however, there are no further constraints on the content within the frames. The ACARS control unit 28, therefore, readily gates the characters within the frame to the processing device 30. Because of the strict ACARS protocol, the processing device 30 only acts to alter the character stream as that character stream occurs within the frames.

Referring, as well, to FIG. 2, an exemplary 8-bit to 6-bit mapping table 40 is set forth. The processing device 30 (FIG. 1) receives character-based data, encodes the character-based data into a bit stream by packing each 8-bit character data into a 6-bit representation. The processor 36 concatenates the 6-bit representations into a single bit data stream. This "packing" compresses the size of the data expressed in bits by 25 percent.

The "packing" in one exemplary embodiment is achieved by simply mapping the 8-bit characters into 6-bit representations according to the mapping table 40. Thus, for example, the 8-bit character for "P" 42 has the value "0×50" 45. The corresponding 6-bit value is drawn from the table as "0×31" 48. As a result, a strict 6-bit data stream results.

To achieve a "1 to 1" mapping, a number of the allowable characters are removed to drop the total characters needing representation to $2^6$ or 64. One simple means of reducing the necessary character representations is to do away with the lower case representations of letters removing 26 characters from the total population. In an exemplary embodiment, both the lower and the upper case letters are mapped into the same 6-bit representation.

In a second embodiment, the first 64 characters of the total population of 96 transmittable characters are mapped into 6-bit representations. The remaining 32 characters are mapped with an additional flag bit as a 7-bit character. In concatenation, into the character stream, the result is a generally 6-bit character stream expressed as a datastream. Chopping the datastream into 8-bit bytes, regardless of the true bit length of any character results in a shorter character stream. The chopping of the data stream is known as the Base 64 chopping.

When performing the Base 64 chopping, convert binary data into transmittable characters, the 6-bit characters produced by mapping (64 unique values) are converted at the look-up table 38 to 64 unique characters. Because there are 96 characters that are transmittable over ACARS, the 6-bit representations cannot express the remaining 32 characters. In producing the generally 6-bit character stream, the processor 36 retrieves values from the look-ahead buffer 32 in a manner to look ahead 2 bits to determine if the complete 8-bit value is one of the 32 characters that cannot be resolved as 6-bit characters. In another exemplary embodiment, these eight bits require no expansion and thus, remain in their original form.

Some compression occurs by Base 64 chopping. Assuming, for purposes of demonstration, that the character stream subjected to the 8- to 6-bit mapping is random, and since there are 256 possible bit patterns for a byte, the chance of encountering one of the 32 unresolvable characters is 12.5%. Every time one of these characters is encountered, two bits of length are saved. An overall average decrease of the character stream by means of the Base 64 chopping is 3.125% on this random data stream. Suitable assignment based upon usage in plaintext can further enhance the compression effect.

Figure 3:
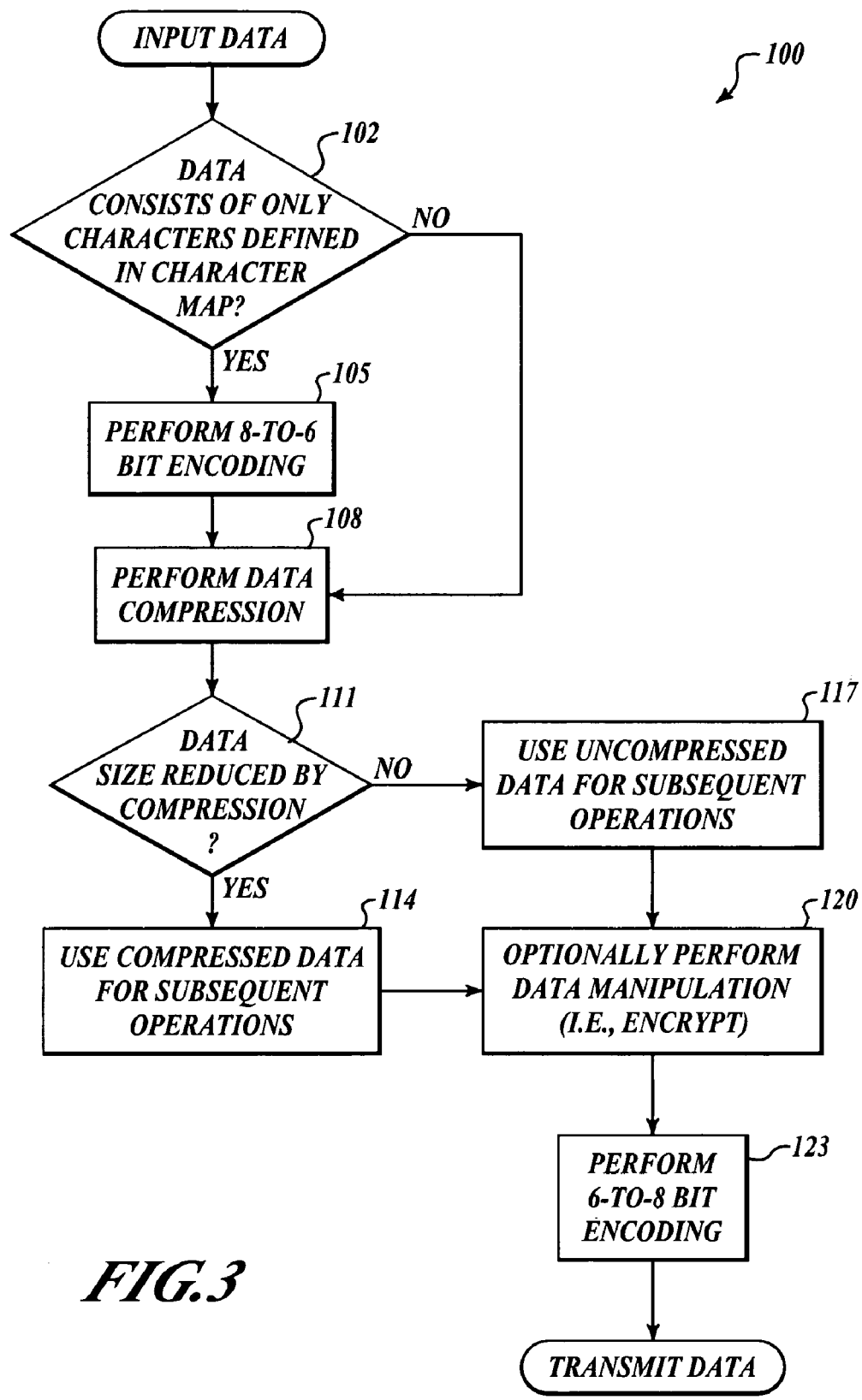
FIG. 3 is a flow chart for compiling an ACARS message for sending.

Referring to FIG. 3, in a method 100 for transmission of ACARS data, a stream of ACARS data is tested for content at a block 102. Where the data contains a suitable header to describe the content as characters, an 8- to 6-bit conversion, as described herein occurs at a block 105. If the content of a frame is non-character data, the 8- to 6-bit conversion at the block 105 is obviated and the method proceeds to an optional data compression at a block 108.

At the block 108, a standard compression algorithm is applied to the data. Any standard compression technique may be used on the concatenated data stream. Examples of such compression are either of known DEFLATE or v.42bis algorithms which yield relatively good results when that data stream size is small. Application of one of these standard compression techniques can reduce the bit stream by as much as 25 to 33 percent depending on the size of the data.

Generally, the data stream will be shortened according to the exploited compression technique. Studies conducted during ATN specification development proved that the DEFLATE algorithm can compress an arbitrary stream of data and reduce its size by a factor of two to five. Therefore, use of the DEFLATE algorithm on the data stream will, generally, yield the same or a better-sized payload, as the original. To assure the user of optimal configuration of data, the payload size is tested.

At a block 111, the size of the uncompressed data stream is compared to that of the compressed data payload. If the compressed data stream is smaller, the compressed data stream is selected for use at a block 114. Where the original data stream is smaller, the original data stream is selected for use at a block 117.

In some instances, the data stream produced can be immediate sent for recharacterization at the block 123, but where an optional encryption of data is desired, such encryption of the data may advantageously occur at a block 120. The encryption process adds no length to the size of the compressed bit stream. As with compression, encryption is readily performed by known processes, such as with the several public key encryption means known including PGP encryption.

At a block 123, the data stream is reconverted to a character stream by Base 64 chopping thus converting each 6-bit user data into a distinct resulting 8-bit ACARS character. This encoding scheme ensures that the output characters are of a type that is approved for transmission over the ACARS network. By concatenating generally 6-bit user data into a stream that is then cut into 8-bit bytes, regardless of the actual end of a particular character, the two extra bits are exploited to shorten the total data stream size. While the resulting 8-bit characters have perfect fidelity to the data stream, there is no one-to-one correspondence between the original characters and the characters that the data stream produces; the difference generates the economy in transmission.

The encoding scheme expands the data stream bit for bit by 33 and ⅓ percent (thirty-three and one-third percent). However, the size of bit-oriented user data is no larger than the original character-oriented user data, and may be smaller depending upon the effectiveness of the compression algorithm applied to the bit stream. The standard ACARS bit-to-character encoding scheme, however doubles the size of bit-oriented user data, and is by-passed by the 8- to 6-bit mapping and accompanying Base 64 chopping.

Figure 4:
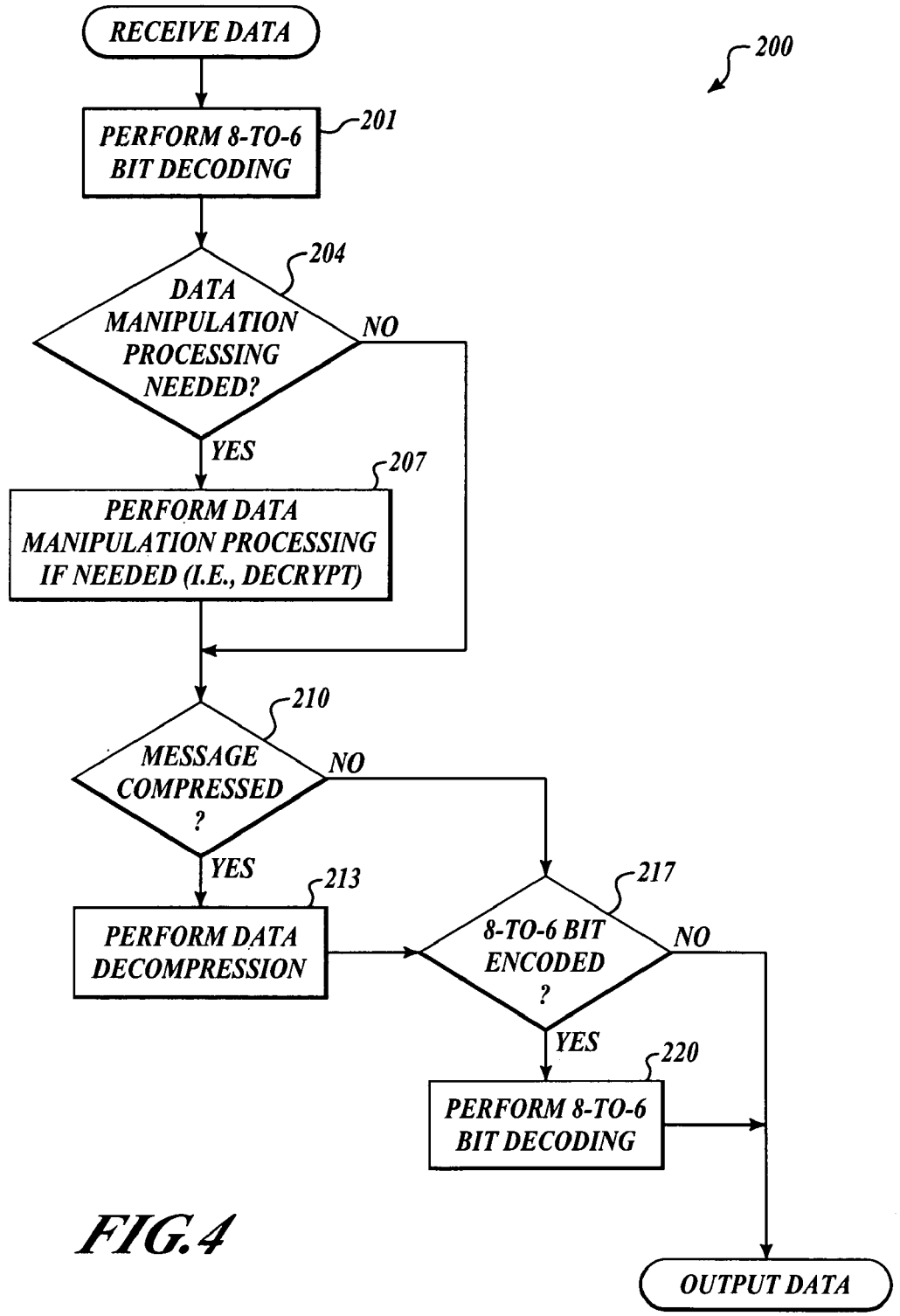
FIG. 4 is a flow chart for decompiling an ACARS message received.

In receiving, rather than sending, as shown in reference to FIG. 4, a method 200 reverses the sending method 100 (FIG. 3). At a block 201, the 8-bit character stream is expanded and the bits are assigned again, in accord with the original characters that make up the character stream. The 8-bit character stream is examined for the presence of characters that are not resolvable in purely 6-bit mapping. The processor 36 (FIG. 1) retrieves values from the look-ahead buffer 32 (FIG. 1) in a manner to look ahead 2 bits to determine if the complete 8-bit value is one of the 32 characters that cannot be resolved as 6-bit characters. Based upon the values retrieved, the 8-bit character stream is resolved into a generally 6-bit character stream.

At a block 204, decryption occurs if headers accompanying the character stream or the character stream itself indicates that encryption occurred during the assembly of the message according to the sending method 100 (FIG. 3). If the message requires decryption, it occurs at a block 207.

At a block 210, the resulting decrypted data stream is examined to determine if, during the assembly of the message according to the sending method 100 (FIG. 3), a compression algorithm was used to alter the data stream. If so, the decompression according to the chosen algorithm occurs at a block 213.

At a block, the method 200 continues by testing if the resulting test is the result of 8- to 6-bit mapping. If the 8- to 6-bit mapping has occurred, at a block 220, the inverse mapping occurs to generate the plaintext message.

While the preferred embodiment of the invention has been illustrated and described, as noted above, many changes can be made without departing from the spirit and scope of the invention. For example, further encryption or decryption of the plaintext might occur prior outside of either of the sending method 100 (FIG. 3) or the receiving method 200 (FIG. 4) Accordingly, the scope of the invention is not limited by the disclosure of the preferred embodiment. Instead, the invention should be determined entirely by reference to the claims that follow.

What is claimed is:

1. A method for a loss-less reduction of transmission bits in the encoding and transmission of data in a character stream, the method comprising:
   determining if data comprises characters defined in stored data;
   when the data comprises characters defined in the stored data, mapping eight-bit characters into a six-bit map to create a generally six-bit character stream; and
   encoding the generally six-bit character stream into an eight-bit character stream prior to transmission.

2. The method of claim 1, further comprising:
   encrypting the generally six-bit character stream to produce an encrypted generally six-bit character stream,
   wherein encoding includes encoding the encrypted generally six-bit character stream.

3. The method of claim 1, further comprising:
compressing the generally six-bit character stream to produce a compressed six-bit character stream and
wherein encoding includes encoding the compressed six-bit character stream.

4. The method of claim 1, wherein the mapping of the eight-bit characters includes:
substituting a first six-bit character for an eight-bit character according to a first look-up table;
comparing a second eight-bit character to characters contained in to a second look-up table to produced a selected character; and
concatenating the first six-bit character with the selected character to produce a generally six-bit character stream.

5. The method of claim 4, wherein:
the selected character includes a six-bit character corresponding in the second look-up table to an upper-case representation of the second eight-bit character.

6. The method of claim 4, wherein:
the selected character includes a designated eight-bit character.

7. The method of claim 4, wherein at least one of the selected characters includes a flag bit.

8. An ACARS control unit for the compiling of ACARS messages, the unit comprising:
a memory for storing an eight-bit to six-bit mapping; and
a processing device coupled to the memory and configured for determining if data comprises characters defined in the eight-bit to six-bit mapping, wherein the processing device is further configured for mapping eight-bit characters into the six-bit map to create a generally six-bit character stream responsive to a positive determination, the processing device being further configured for encoding the generally six-bit character stream into an eight-bit character stream.

9. The unit of claim 8, wherein:
the processing device is further configured for encrypting the generally six-bit character stream to produce an encrypted generally six-bit character stream, and
encoding includes encoding the encrypted generally six-bit character stream.

10. The unit of claim 8, wherein:
the processing device is further configured for compressing the generally six-bit character stream to produce a compressed six-bit character stream and
wherein encoding includes encoding the compressed six-bit character stream.

11. The unit of claim 8, wherein the processing device configured for mapping of the eight-bit is further configured for:
substituting a first six-bit character for an eight-bit character according to a look-up table;
comparing a second eight-bit character to characters contained in the look-up table to produced a selected character;
concatenating the first six-bit character with the selected character to produce a generally six-bit character stream.

12. The unit of claim 11, wherein:
the selected character includes a six-bit character corresponding in the look-up table to an upper-case representation of the second eight-bit character.

13. The unit of claim 11, wherein:
the selected character includes a designated eight-bit character.

14. The unit of claim 11, wherein at least one selected character includes a flag bit.

15. An ACARS system for compiling messages, the system including:
a processing device configured for determining if data comprises characters defined in an eight-bit to six-bit mapping,
further configured for mapping eight-bit characters in an eight-bit character stream into a six-bit map to create a generally six-bit character stream responsive to a positive determination; and
further configured for encoding the generally six-bit character stream into an eight-bit character stream.

16. The ACARS system of claim 15, wherein:
the processing device includes a look-up table, the look-up table configured to retrieve substituted six-bit characters in response to the presence of the eight-bit character received at a processor.

17. The ACARS system of claim 15, wherein:
the processing device includes a look-up table, the look up table configured to retrieve substituted eight bit characters in response to the presence of the eight-bit character received at the processor.

18. The ACARS system of claim 15 further comprising:
a look-ahead buffer, the look-ahead buffer configured to receive the eight-bit character stream from an ACARS control unit and to retrieve characters according to processor requests, the retrieved characters provided at the processor.

19. The ACARS system of claim 17 wherein the look-ahead buffer retrieves eight-bit characters in the character stream according to an order of receipt.

20. The ACARS system of claim 18, wherein the processor generates a generally six-bit character stream according to the eight-bit characters received at the processor according to an algorithm.

21. The method of claim 1, wherein, when the data does not comprise characters defined in the stored data, the method further comprises encrypting the data in the character stream.

22. The method of claim 1, wherein, when the data does not comprise characters defined in the stored data, the method further comprises compressing the data in the character stream to produce a compressed character stream.

23. The method of claim 1, wherein the stored data includes at least one look-up table, and wherein the mapping of the eight-bit characters includes substituting a first six-bit character for an eight-bit character according to the look-up table.

* * * * *